(12) United States Patent
Piasecki et al.

(10) Patent No.: US 7,271,758 B2
(45) Date of Patent: Sep. 18, 2007

(54) GAIN ADJUST FOR SAR ADC

(75) Inventors: Douglas Piasecki, Austin, TX (US); Michael Odland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/170,591

(22) Filed: Jun. 29, 2005

(65) Prior Publication Data

US 2007/0001890 A1 Jan. 4, 2007

(51) Int. Cl.
*H03M 1/12* (2006.01)
(52) U.S. Cl. .................. 341/172; 341/161; 341/162; 341/163
(58) Field of Classification Search ............... 341/118, 341/120, 161–162, 172
See application file for complete search history.

(56) References Cited

U.S. PATENT DOCUMENTS

| | | | |
|---|---|---|---|
| 4,490,713 A * | 12/1984 | Mrozowski et al. | 341/163 |
| 4,630,187 A | 12/1986 | Henze | |
| 6,281,818 B1 * | 8/2001 | Miller | 341/120 |
| 6,600,437 B1 * | 7/2003 | Confalonieri et al. | 341/150 |
| 6,720,903 B2 * | 4/2004 | Confalonieri et al. | 341/172 |
| 6,839,013 B1 * | 1/2005 | Cummins et al. | 341/155 |
| 6,882,298 B2 * | 4/2005 | Leung et al. | 341/172 |
| 6,956,520 B2 * | 10/2005 | Leung et al. | 341/172 |
| 2004/0095122 A1 | 5/2004 | Chapuis | |
| 2004/0155637 A1 | 8/2004 | Chapuis | |
| 2004/0196014 A1 | 10/2004 | Chapuis | |

OTHER PUBLICATIONS

Aleksandar Prodic, et al.; Mixed-Signal Simulation of Digitally Controlled Switching Converters; Colorado Power Electronics Center, Department of Electrical and Computer Engineering, University of Colorado at Boulder; Boulder, CO 80309-0425, USA, 6 pages—unknown date/month.

Patella, B.J. et al.; High-Frequency Digital PWM Controller IC for DC-DC Converters; Power Electronics, IEEE, vol. 18, Issue 1; Jan. 2003, only abstract provided.

Albert M. Wu, et al.; Digital PWM Control: Application in Voltage Regulation Modules; Department of Electrical Engineering and Computer Sciences, University of California, Berkeley; IEEE 1999, 7 pages.

(Continued)

*Primary Examiner*—Khai M. Nguyen
(74) *Attorney, Agent, or Firm*—Howison & Arnott, L.L.P.

(57) ABSTRACT

A SAR analog-to-digital Converter (ADC) is disclosed with variable gain having a SAR capacitor array with a plurality of switched capacitors therein with varying weights and a SAR controller for sampling an input voltage thereon in a sampling phase, and redistributing the charge stored thereon in a conversion phase in accordance with a SAR conversion algorithm. A gain adjust register is provided for defining an amount of charge to be added or subtracted from the capacitor array prior to the conversion phase relative to a predetermined amount of charge. A charge control device varies the amount of charge stored in the array prior to the conversion phase in accordance with the contents of the gain adjust register such that the amount of charge redistributed during the conversion phase is adjusted.

14 Claims, 5 Drawing Sheets

OTHER PUBLICATIONS

F. Bartoni, et al.; DC/DC Switching Power Converter with Radiation Hardened Digital Control Based on SRAM FPGAs; P/MAPLD 2004, 4 pages.

Angel V. Peterchev, et al.; Quantization Resolution and Limit Cycling in Digitally Controlled PWM Converters: Department of Electrical Engineering and Computer Science, University of California, Berkeley; 7 pages—unknown date.

Biranchinath Sahu, et al.; Adaptive Power Management of Linear RF Power Amplifiers in Mobile Handsets: An Integrated System Design Approach; Gerogia Tech Analog and Power IC Design Laboratory, School of Electrical and Computer Engineering, Georgia Institute of Technology; Submission for IEEE Asia Pacific 2004, 4 pages.

Aleksandar Prodic, et al.; Design of a Digital PID Regulator Based on Look-Up Tables for Control of High-Frequency DC-DC Converters; Colorado Power Electronics Center, Department of Electrixcal and Computer Engineering, University of Colorado; Boulder, CO 80309; 0425, USA, 5 pages—unknown date.

John Sustersic, et al.; Design and Implementation of a Digital Controller for DC-to-DC Power Converters; NASA Clen Research Center, Robert Button; The Advanced Engineering Research Laboratory, Cleveland State University. Copyright 2000 Society of Automotive Engineers, Inc., 7 pages.

Gu-Yeon Wei, et al.; A Fully Digital, Energy-Efficient, Adaptive Power-Supply Regulator; IEEE Journal of Solid State Circuits, vol. 34, No. 4, Apr. 1999, 9 pages.

Dragan Maksimovic, et al.; Custom IC Blocks for Enabling Digital Control in Switching Power Converters; Colorado Power Electronics Center, University of Colorado, Boulder, Jul. 11, 2003, 43 pages.

LM2636 5-Bit Programmable Synchronous Buck Regulator Controller, National Semiconductor, Mar. 2005; 2005 National Semiconductor Corporation, 15 pages.

Jinwen Xiao, et al.; An Ultra-Low-Power Digitally-Controlled Buck Converter IC for Cellular Phone Applications; University of California, Berkeley; IEEE 2004, 9 pages.

Jinwen Xiao, et al.; Architecture and IC Implementation of a Digital VRM Controller, Department of Electrical Engineering and Computer Science, University of California, Berkeley; IEEE 2001, 10 pages.

* cited by examiner

GAIN ADJUST FOR SAR ADC

TECHNICAL FIELD OF THE INVENTION

The present invention pertains in general to data converters and, more particularly, to a SAR analog-to-digital converter having an adjustable gain.

CROSS-REFERENCE TO RELATED APPLICATIONS

This application is related to U.S. patent application Ser. No. 10/881,793, filed Jun. 30, 2004, and entitled "MICROCONTROLLER UNIT (MCU) WITH RTC and U.S. patent application Ser. No. 10/752,913, filed Jan. 7, 2004, entitled "CAPACITOR CALIBRATION IN SAR CONVERTER", both of which are incorporated herein by reference.

BACKGROUND OF THE INVENTION

SAR analog-to-digital converters utilize a binary weighted capacitor array which is operable to operate in a tracking or sample mode wherein an input voltage is sampled onto one plate of a plurality of capacitors in the array. After sampling, the SAR converter is placed in a convert mode. In the convert mode, the plates of the capacitors that were connected to the input voltage are selectively connected between ground and a reference voltage. A comparator connected to the other plate of the capacitors is operable to compare the voltage on that plate with the threshold voltage in accordance with a conventional SAR search algorithm. The dynamic range of the SAR converter is typically defined by a threshold voltage to which the comparator compares the voltage on the other plate of the capacitors in the array during the conversion cycle. Typically, the SAR converter capacitor array is set up for unity gain. If the input voltage is sampled on a set number of capacitors in the array and then converted against that set number of capacitors in the array, the unity gain will hold true. However, if a different gain then unity is desired, amplifiers and the such are typically utilized for both providing gain or providing attenuation.

SUMMARY OF THE INVENTION

The present invention disclosed and claimed herein, in one aspect thereof, comprises a SAR analog-to-digital Converter (ADC) with variable gain having a SAR capacitor array with a plurality of switched capacitors therein with varying weights and a SAR controller for sampling an input voltage thereon in a sampling phase, and redistributing the charge stored thereon in a conversion phase in accordance with a SAR conversion algorithm. A gain adjust register is provided for defining an amount of charge to be added or subtracted from the capacitor array prior to the conversion phase relative to a predetermined amount of charge. A charge control device varies the amount of charge stored in the array prior to the conversion phase in accordance with the contents of the gain adjust register such that the amount of charge redistributed during the conversion phase is adjusted.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
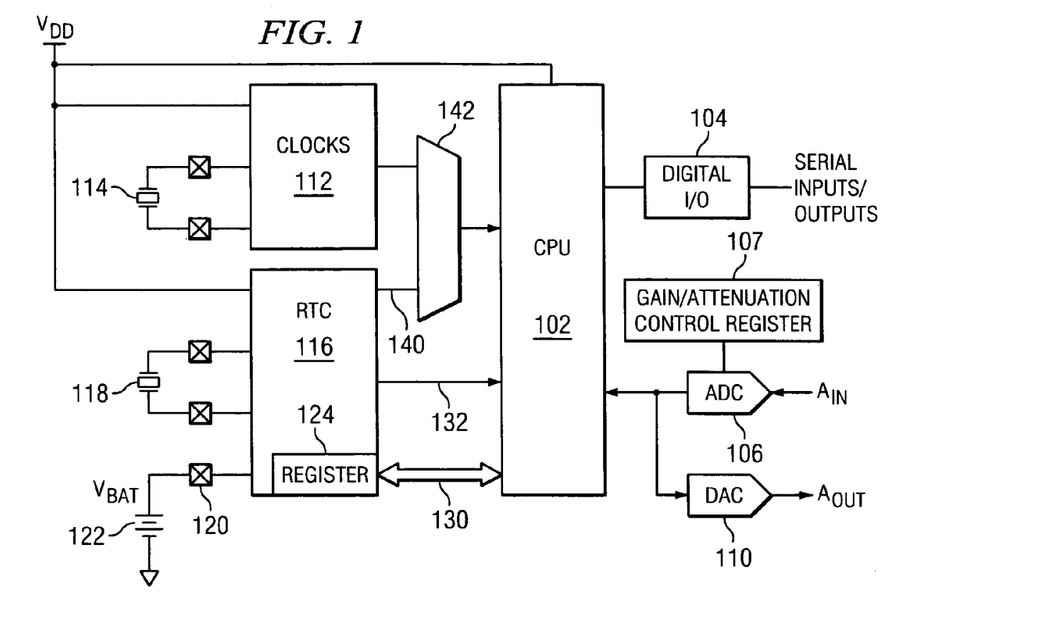
FIG. 1 illustrates an overall diagrammatic view of an MCU with a built-in ADC and gain control register.

Referring now to FIG. 1, there is illustrated a block diagram of a processor-based system that drives the mixed signal technologies that include as a part thereof, a digital section including a central processing unit (CPU) 102 and a digital I/O section 104 that is operable to interface with various serial inputs and outputs. The system also includes the analog section which provides for an analog-to-digital converter (ADC) 106 that is operable to receive one or more analog inputs and also provides a digital-to-analog converter (DAC) 110 for allowing digital information from the CPU 102 to be converted to analog output information. A gain control register 107 providing for control of the gain of the ADC 106, or attenuation, is provided to allow the user to introduce attenuation into. The operation of the CPU 102 is controlled by various clocks 112 in a primary oscillator section. These are the operational clocks that control the overall operation of the MCU. In one mode, they will be interfaced with a crystal 114 for precision operation thereof. However, as will be described herein below, a precision internal non-crystal based clock can be utilized and, further, there can be a high frequency crystal and a low frequency crystal for two different operational modes. Normally, the output of the block 112 provides the operating clock with the CPU 102.

There is also provided a separate stand alone real time clock (RTC) block 116. This clock 116 operates on a separate RTC crystal 118 that provides the time base therefor. The RTC 116 interfaces with the chip supply voltage $V_{DD}$, which also drives CPU 102 and the clock block 112. The RTC block 116 also interfaces with a battery terminal 120 and an external back-up battery 122. The RTC 116 has disposed thereon a plurality of registers and RAM memory 124, which are operable to store the timing information associated with the RTC 116. The RTC 116 operates independently with the primary purpose being to maintain current time and date information therein separate and independent of the operation of the digital and analog sections and the power required thereby or provided thereto. This information can be initialized by the CPU 102 through a digital interface 130 with the registers 124. During operation, the RTC 116 will update its internal time and date information, which information is stored in the registers 124. The RTC 116 is operable to generate an interrupt on an interrupt line 132 (to the CPU 102). Therefore, the RTC 116 can interface with the CPU 102 in order to generate an interrupt thereto. As will be described herein below, this interrupt facilitates waking the CPU 102 up when it is placed into an inactive or deep sleep mode. However, the CPU 102 at any time can query the register 124 for information stored therein. The RTC 116, as will also be described herein below, is a very low power circuit that draws very little current, the current less than 1.0 μA. The RTC 116 provides a clock output on a line 140 to a clock multiplexer 142. The multiplexer 142 also receives the output of the clock circuit 112, the output of the multiplexer providing the system clock to the CPU 102. The clock circuit 112 is operable to generate a base frequency of around 25 MHz that can be multiplied or divided. However, the base operating frequency of the RTC 116 of around 32 kHz can provide an alternate low frequency time base for the system clock. This will allow the CPU 102 to operate at a low frequency for power conservation purposes.

Figure 2:
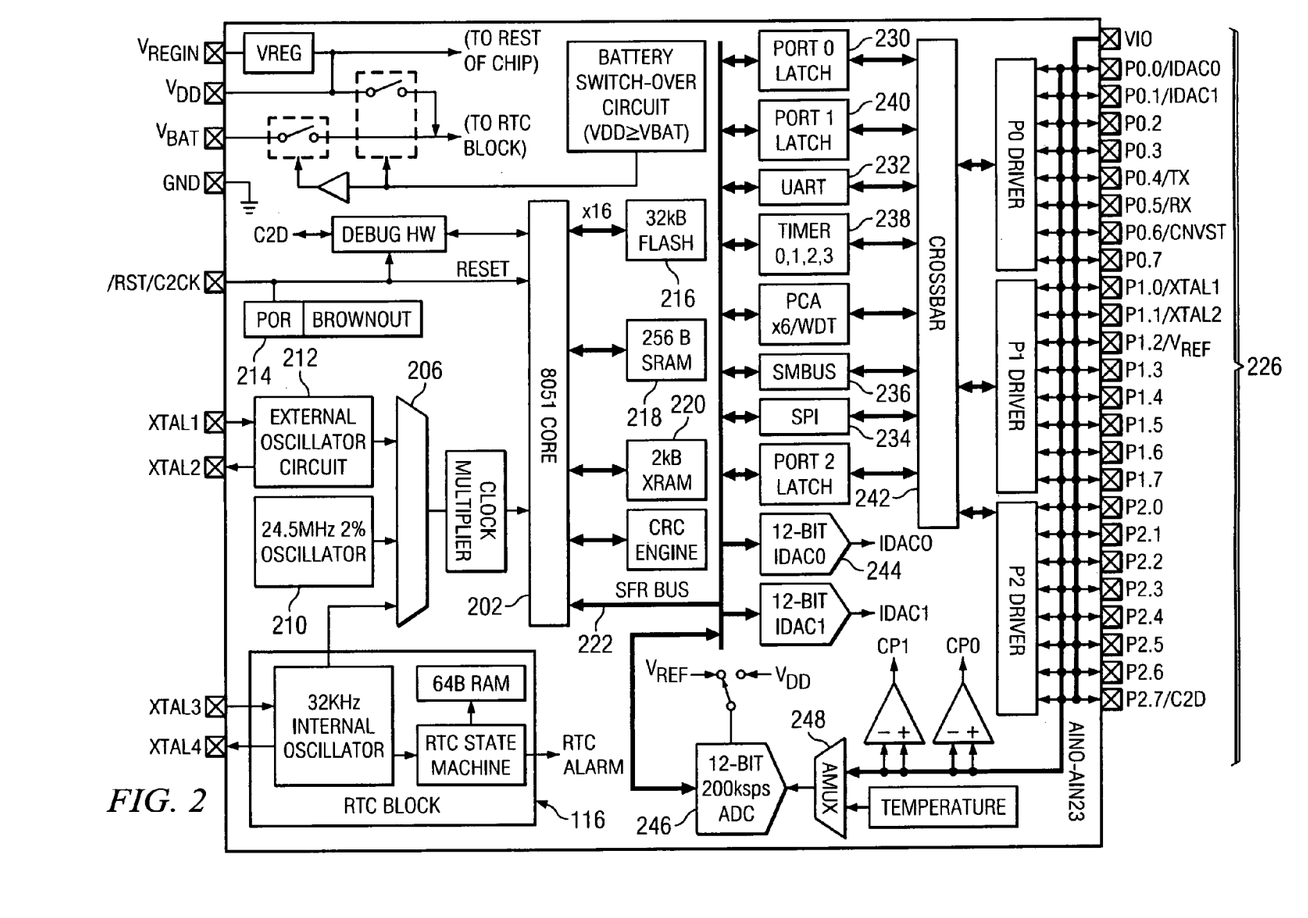
FIG. 2 illustrates an overall block diagram of the MCU chip illustrating the various functional blocks thereof.

Referring now to FIG. 2, there is illustrated a block diagram of the MCU. As noted herein above, the MCU is generally of the type similar to part number C8051F330/1 manufactured by Silicon Laboratories Inc., with the exception of the addition of the RTC 116. The MCU includes in the center thereof a processing core 202 which is typically comprised of a conventional microprocessor of the type "8051." The processing core 402 receives a clock signal on a line 204 from a multiplexer 206. The multiplexer 206 is operable to select among multiple clocks. There is provided an 80 kHz internal oscillator 208, a 24.5 MHz trimmable internal precision oscillator 212 or an external crystal controlled oscillator 210. The precision internal oscillator 212 is described in U.S. patent application Ser. No. 10/244,344, entitled "PRECISION OSCILLATOR FOR AN ASYNCHRONOUS TRANSMISSION SYSTEM," filed Sep. 16, 2002, which is incorporated herein by reference. The processing core 202 is also operable to receive an external reset on terminal 213 or is operable to receive the reset signal from a power-on-reset block 214, all of which provide a reset to processing core 202. The processing core 202 has associated therewith a plurality of memory resources, those being either flash memory 216, SRAM memory 218 or random access memory 220. The processing core 202 interfaces with various digital circuitry through an on-board digital bus 222 which allows the processing core 202 to interface with various operating pins 226 that can interface external to the chip to receive digital values, output digital values, receive analog values or output analog values. Various digital I/O circuitry are provided, these being latch circuitry 230, serial port interface circuitry, such as a UART 232, an SPI circuit 234 or an SMBus interface circuit 236. Three timers 238 are provided in addition to another latch circuit 240. All of this circuitry 230-240 is interfacable to the output pins 226 through a crossbar device 242, which is operable to configurably interface these devices with select ones of the outputs. The digital input/outputs can also be interfaced to a digital-to-analog converter 244 for allowing a digital output to be converted to an analog output, or to the digital output of an analog-to-digital converter 246 that receives analog input signals from an analog multiplexer 248 interfaced to a plurality of the input pins on the integrated circuit. The analog multiplexer 248 allows for multiple outputs to be sensed through the pins 226 such that the ADC can be interfaced to various sensors. Again, the MCU 102 is a conventional circuit.

Figure 3:
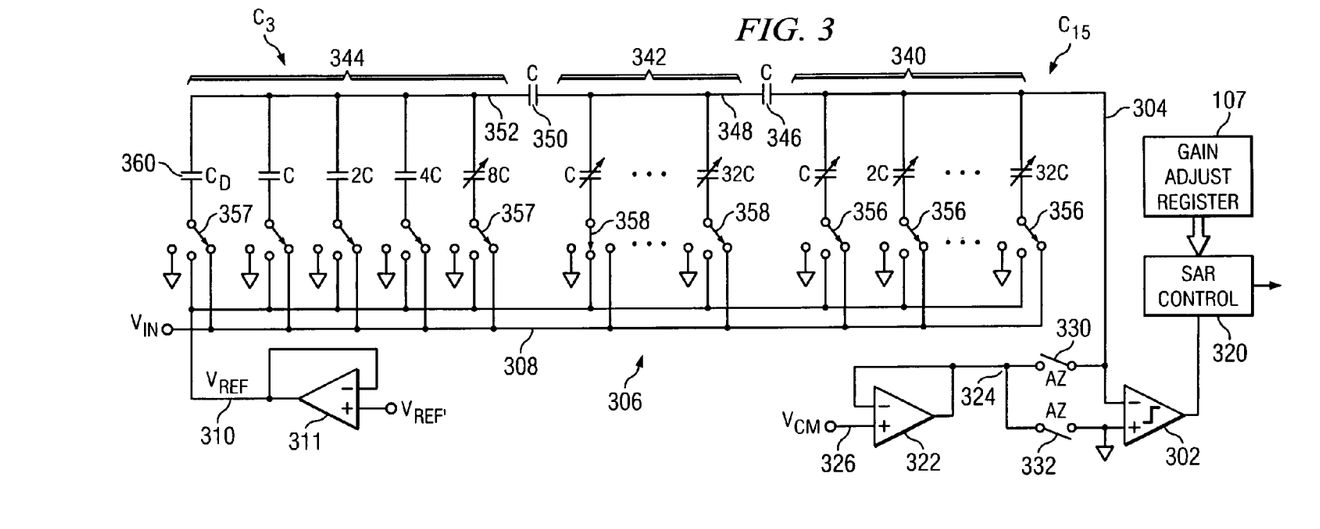
FIG. 3 illustrates an overall diagrammatic view of a differential ADC of the present disclosure.

Referring now to FIG. 3, there is illustrated a schematic diagram of the overall ADC 246. The ADC is comprised of a comparator section 302 having a positive and a negative input. The negative input is connected to a node 304, which node is connected to a capacitor array 306. The capacitor array, in accordance with a conventional successive approximation algorithm, is a charge-redistribution, binary weighted switched-capacitor array that will have one plate of the capacitors associated therewith connected to an input voltage on an input node 308 or a reference voltage on a node 310 or ground, as will be described in more detail herein below. The reference voltage on node 310 is provided by a reference voltage driver 311 that is operable to receive an input reference voltage $V_{ref}'$ on a positive input, driver 311 having a negative input connected to the output thereof, the output connected to node 310 to provide a voltage $V_{ref}$. The positive input of the comparator 302 is connected to a node 312, which node 312 is typically, in a single ended operation, connected to a common mode voltage.

The output of the comparator 302 is connected to a successive approximation register (SAR) control block 320 which is operable to execute the successive approximation algorithm. As is well known in the art, the successive approximation register is operable to first sample the input voltage across all of the capacitors in the capacitor array which, in the present embodiment as will be described hereinbelow actually only provides for sampling the input voltage over all or only a portion of the capacitors. However, conventional SAR algorithms will sample the input voltage across all of the capacitors. After this, select ones of the capacitors have the bottom plates thereof connected to ground and select ones of the capacitors have the bottom plates thereof connected to the reference voltage node 310 in a predetermined order. This causes redistribution of charge which changes the voltage on node 304. This is compared with a reference voltage and, if the voltage on node 304 is above the reference voltage, then this capacitor has the bottom plate thereof returned to ground. However, if the voltage on node 304 does not rise above the reference voltage, then the voltage from the bottom plate of this capacitor remains at the reference node voltage on node 310. This is a successive operation which sequentially steps through each of the capacitors from the most significant or largest capacitor to the least significant or smallest capacitor. Again, this SAR operation is conventional.

In order to set a reference voltage on node 304, a common mode voltage driver 322 is provided that is operable to drive a node 324, a low impedance, with a common mode voltage, $V_{CM}$, output thereof, the output connected to node 324. This is a non-inverting driver. Node 324 is connected via an auto-zero switch 330 to node 304 and via an auto-zero switch 332 to node 312. When the input voltage on node 308 is sampled onto the capacitor array 306, switches 330 and 332, are configured such that $V_{CM}$ is connected to nodes 304 and 312.

The capacitor array is configured as a bridge capacitor array. The bridge capacitor array, in this embodiment, is associated with a 16-bit SAR ADC. This is configured with a bridge capacitor array with three capacitor sections, a capacitor section 340, a capacitor section 342 and a capacitor section 344. Capacitor section 340 is comprised of a plurality of capacitors each having the upper plate thereof connected directly to node 304 and the bottom plates of each of the capacitors in section 340 connected to switched nodes.

Capacitor section 340 at node 304 is connected to one side of a series capacitor 346, the other side thereof connected to a node 348. Node 348 is connected to the top plates of a plurality of capacitors associated with capacitor section 342, the bottom plates thereof each connected to individual switched nodes. Node 348 is connected to one side of a series capacitor 350, the other side thereof connected to a node 352 associated with capacitor section 344. Node 352 is connected to the top plates of each of capacitors 357 in capacitor section 344, the bottom plates of each of the capacitors in capacitor section 344 connected to individual switched nodes.

As will be described in more detail herein below, the capacitors in section 340 range from a high value to a low value. Capacitors are referred to in relationship to a common unitary value "C" that represents a unit capacitance value. The capacitor section 340 has capacitors that are binary weighted and range in value from C to 32C. Each of the capacitors is noted as being calibratable, i.e., each can have the value thereof varied. The binary weighting will result in capacitors arranged in the following sequence: C, 2C, 8C, 16C and 32C. Each of the capacitors from C through 32C have the bottom plate thereof connected to a switch 356 that can switch between ground, the $V_{ref}$ node and the $V_{in}$ node 308.

In capacitor section 342, the capacitors range in a binary weighting succession from C through 32C, each of the capacitors therein having the top plate thereof connected to node 348 and the bottom plate thereof connected to an associated switch 358 which can be connected between ground, the $V_{ref}$ node 310 and the $V_{in}$ node 308. Capacitor section 344 has binary weighted capacitors that range from C through 8C and a dummy capacitor 360 that has the value of C. The capacitors in section 344 have the top plate thereof connected to node 352 and the bottom plate thereof connected to an associated switch 357 for each capacitor therein that can be connected to ground, the $V_{ref}$ node 310 and the $V_{in}$ node 308. The operation of the SAR control will be described hereinbelow with respect to the operation thereof. In addition, although not shown, there is an additional parasitic capacitor that will have the operation thereof described hereinbelow.

Figure 3A:
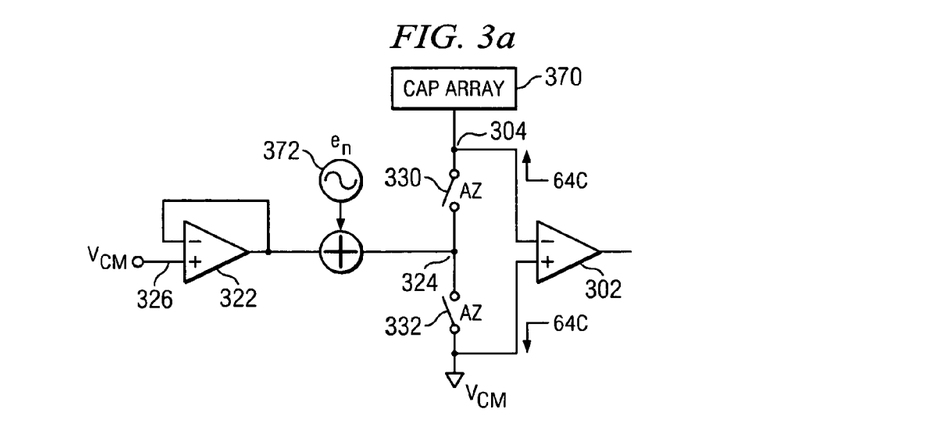
FIG. 3a illustrates a detailed schematic diagram of a common mode driver interface.

Referring now to FIG. 3a, there is illustrated a detailed schematic diagram of the interface of the common mode driver 322 with the inputs to the comparator 302. As noted hereinabove, this is configured as a single ended operation which, in the normal prior art operation, would have one side thereof connected to a fixed voltage such as $V_{CM}$. In that operation, the common mode driver would typically provide the common mode voltage to the negative input on node 304 to apply the common mode voltage to the node 304 during the sampling operation. However, as noted hereinabove, there are provided two switches 330 and 332, which connect the common mode input to both the negative input and the positive input on nodes 304 and 312, respectively. The reference node is connected to ground. The common mode driver, as noted herein, has a high input impedance on the positive input on node 326, and the output on node 324 is a low impedance driver.

Figure 4A:
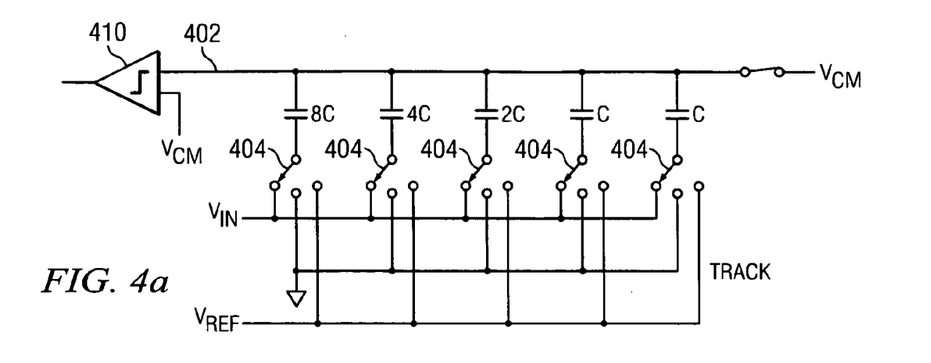
FIGS. 4a and 4b illustrate an embodiment of a conventional tracking and conversion operation.
Figure 4B:
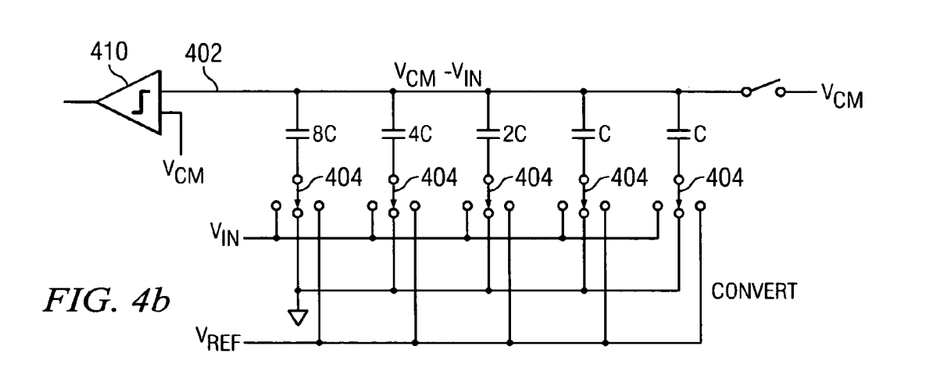

Referring now to FIGS. 4a and 4b, there is illustrated an embodiment of a conventional tracking and conversion operation. With specific reference to FIG. 4a, there is illustrated a 4-bit SAR array with four capacitors in weight from C, 2C, 4C to 8C. They are connected on one side thereof at a common node plate to a common node 402 and each of them have associated therewith a switch 404 attached to a switched plate thereof. There is also provided a dummy capacitor of a weight C. During the tracking phase or the sampling phase, each of the switches 404 is configured to be connected to the $V_{in}$ terminal. This will allow the voltage of $V_{in}$ to be sampled on the one plate thereof associated with the switches 404. The common node 404, during the tracking phase, is connected to a common node voltage.

With specific reference to FIG. 4b, there is illustrated the conventional conversion phase. In this phase, the first step is to disconnect the common node 402 from $V_{CM}$ to allow it to float. This common node 402 is connected to the input of a comparator 410 which is operable to compare the voltage on node 402 with the voltage $V_{CM}$. During the conversion phase, the switched plate of each of the capacitors is initially connected to ground through the switch 404. This will cause the voltage on common node 404 to be pushed downward to a voltage of $V_{CM}-V_{in}$. Thereafter, each of the switches 404 will be selectively connected to $V_{ref}$ in accordance with a SAR search algorithm to redistribute the charge and determine the change in the voltage on node 402. Since the charge on the capacitors is equal to $CV_{in}$, when that amount of charge is redistributed to the other capacitors, the voltage on node 402 will be raised above $V_{CM}$ in proportion to the charge on the one of the SAR capacitors switched until the correct combination of capacitors with their switched plate connected to $V_{ref}$ causes the voltage on the node 402 to substantially equal $V_{CM}$, such that the digital value of the SAR converter can be determined. The SAR controller performs this operation in a conventional manner by first connecting the switch 404 associated with the MSB capacitor, the 8C capacitor, to $V_{ref}$ and determining if the voltage on node 402 goes above $V_{CM}$. If so, then this change is too large and the switch 404 associated therewith is returned to ground. Then the next lower capacitor, the 4C capacitor, has the switch 404 associated therewith connected to $V_{ref}$. If the voltage on node 402 does not go above $V_{CM}$, then the switch associated with this capacitor remains connected to $V_{ref}$ and the next capacitor, the 2C capacitor, is tested. Since the charge was sampled onto the same number of capacitors utilized for the conversion operation, a gain of "1" will exist such that when the input voltage equals $V_{ref}$, there will be a digital output value of "111." If the input voltage goes above $V_{CM}$, the SAR converter will not be able to resolve this.

Figure 5:
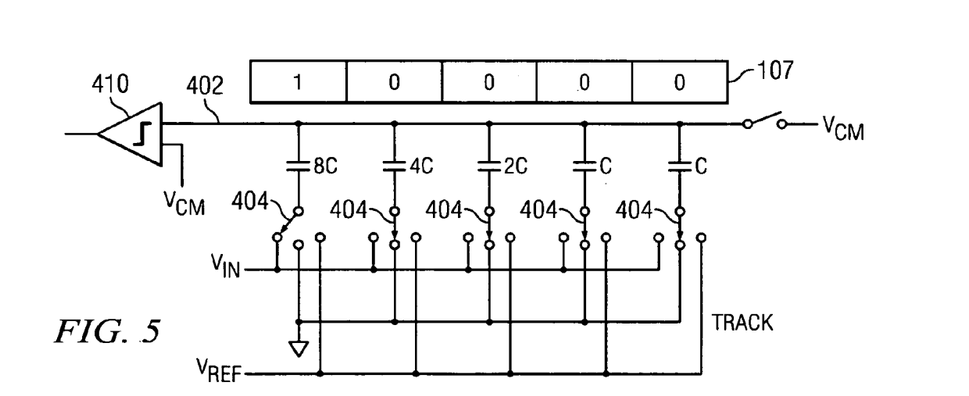
FIG. 5 illustrates an embodiment for "attenuating" the output of the SAR converter utilizing the SAR capacitors.

Referring now to FIG. 5, there is illustrated an embodiment for "attenuating" the output of the SAR converter utilizing the SAR capacitors. To facilitate this, the gain control register 107 is utilized which sets the values of the switches 404 that can be, during the sampling phase, connected to the input voltage. In this embodiment, it can be seen that during the tracking phase, only the 8C capacitor is connected to the input voltage whereas the 4C, 2C, C and dummy capacitor C are connected to ground. Thus, the charge that will be stored on the array will only be equal to $Q=C_{8C}V_{in}$ as opposed to the normal situation where $Q=C_{16C}V_{in}$. Thus, only one-half of the charge will be sampled onto the node 402. The result is that, during the conversion phase, only one-half of the charge can be redistributed. Therefore, when the voltage $V_{in}$ is equal to $V_{ref}$, the digital output will only be half scale. Thus, the full scale operation will require $V_{in}$ to be equal to $2V_{ref}$ in order for the output value to be "1111." Thus, it can be seen that the choice of the code selected only selects the 8C capacitor to be connected to $V_{in}$ during sampling, which will result in an attenuation of "2." It can be seen that selecting any combination of the capacitors to be connected to ground during sampling will result in different attenuations.

Figure 6:
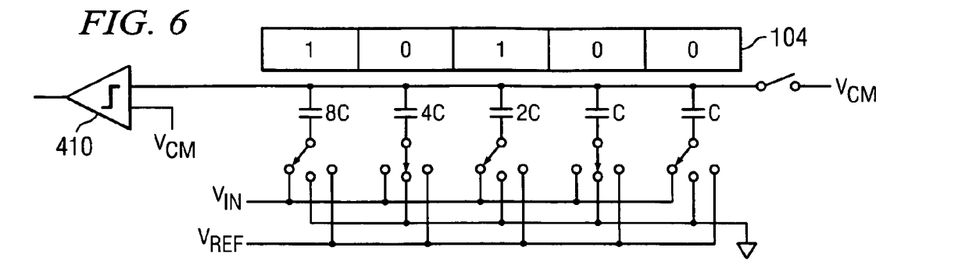
FIG. 6 illustrates an alternate embodiment showing a gain adjust.

Referring now to FIG. 6, there is illustrated an alternate embodiment illustrating another configuration wherein only the capacitors 8C and 2C are connected to $V_{in}$ during sampling. This is facilitated with the code in the register 107 for a special function register associated with the flash 216 that codes the operation of the SAR converter for this operation. Thus, the charge that would be stored on the array would be $Q=C_{10C}V_{in}$, and this will be the only charge that could be distributed to the array during conversion. This will be less than full scale for an input voltage of $V_{ref}$, again, an attenuation operation.

Figure 7:
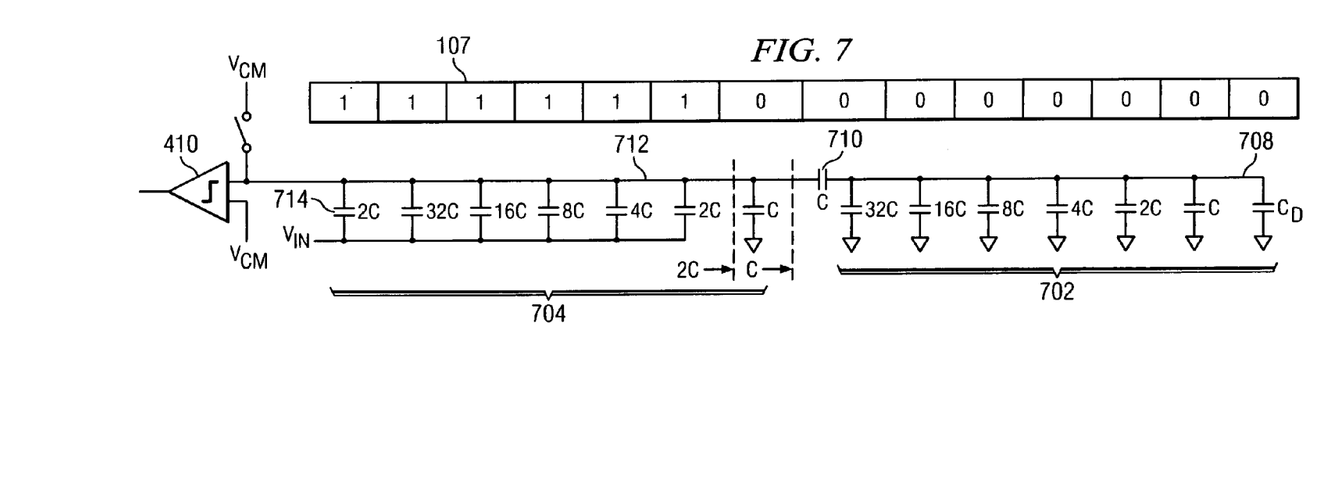
FIG. 7 illustrates an alternate embodiment showing another gain adjust configuration as compared to FIG. 6 with a bridge capacitor array.

Referring now to FIG. 7, there is illustrated a further embodiment utilizing the bridge capacitor array. In the bridge capacitor array in this embodiment, there are defined two sections, a first section 702 and the second section 704. In the first section 702, there are associated six binary weighted capacitors ranging in weight from a unity value of C to 32C, with one plate thereof connected to a common node 708. The other plates thereof, the switched plates, are connected to switches, which in this configuration of FIG. 7 are illustrated in the sampling mode. These are all connected to ground, which will be described hereinbelow. The node 708 is connected through a coupling capacitor 710 to a common node 712 associated with the section 704. The section 704 has six binary weighted capacitors ranging in weight from C to 32C. This provides a total of 64C for both of the sections. However, the coupling capacitor 710 has a weight of C such that the value of the capacitance loading the node 712 is approximately C. The reason for this is that it prevents the very large capacitors associated with the non-bridge capacitor array. This is very conventional. For example, the 32C capacitor in section 704 would have a binary weight from the overall array of 2048 in a non-bridge SAR capacitor array. If not for the capacitor bridge array, this capacitor in the section 804, the MSB capacitor of the entire array, would be quite large compared to the LSB capacitor in the section 702. Again, this is conventional.

In the operation herein, there is illustrated a method of providing a positive gain. In normal operation, within unity gain, the capacitors in the bridge section 702 have the plates thereof connected to ground during a sampling or tracking phase, this being illustrated in FIG. 7. Additionally, the LSB capacitor in section 704, the one with the value C, is also configured such that the switched plate thereof is connected to ground during sampling. Thus, the gain register 107 would have a value of "0" associated with all of those capacitors, indicating that during sampling they would be switched to ground and not to $V_{in}$. Additionally, the LSB capacitor associated with bridge array 704 would be connected to ground during the sampling operations as opposed to $V_{in}$. Thus, the capacitors below the 4C capacitor in bridge section 704 would have an effective value of 2C connected to ground during sampling. Thus, if this was unaccounted for, then the total value of the charge stored on the array during sampling would be $Q=C_{62}V_{in}$ as opposed to $Q=C_{64}V_{in}$. To accommodate for this, an additional parasitic capacitor 714 will be added connected between node 712 and $V_{in}$ during sampling. During conversion, the switched plate of capacitor 714 will be connected to ground. Thus, during sampling, an additional 2C of capacitor is utilized to provide the additional charge necessary to ensure that the entire charge associated with unity gain will be sampled onto the array. During conversion, the only disadvantage would be that this additional amount of capacitance would add to the total capacitance thus decreasing the amount of the delta voltage that will exist at the input to the comparator 410. This delta voltage is proportional to $C_{Toggled}/C_T$.

Because the SAR capacitors associated with the bridge section 702 and the LSB capacitor in bridge section 704 were connected to ground during sampling, thus allowing for a unity gain operation in this configuration, additional capacitors in the bridge section 704 can have their switched plates connected to ground during sampling to attenuate the output voltage and provide for a higher input value associated with a full scale digital output value. By attenuating, an input signal that has a greater than $V_{ref}$ swing can be accommodated within the digital dynamic range of the SAR converter. However, if the voltage on the input had a full scale range of one-half $V_{ref}$, then positive gain would be desired. To account for the positive gain, capacitors in section 702 which were, for unity gain, connected such that the switched plates did not sample the $V_{in}$ voltage during sampling, would be now selectably connected to $V_{in}$. This would result in positive gain due to the fact that more charge was sampled onto the array than is converted. If, for example, the LSB capacitor C in the section 704 had the switched plate thereof connected to $V_{in}$ during sampling, then the charge on the section 704 would be $Q=C_{65}V_{in}$ wherein the conversion therein would only be against $C_{64}$. This would result in a positive gain. All that is required to provide this positive gain is to change the code in the gain register 107.

Figure 8:
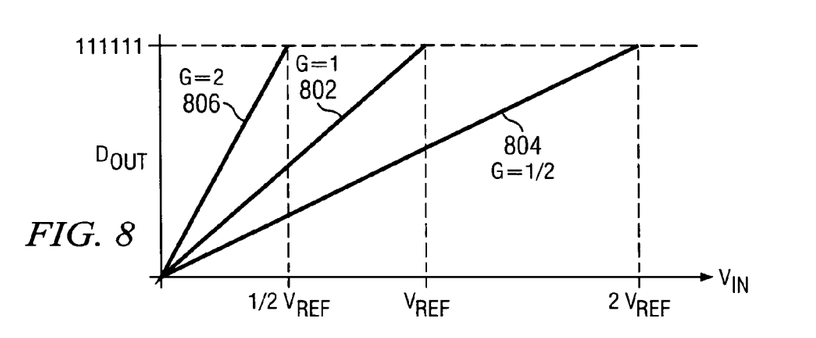
FIG. 8 illustrates a plot of gains for various configurations.

Referring now to FIG. 8, there is illustrated a plot of gains for various configurations. The x-axis represents the input voltage $V_{in}$ and the vertical axis indicates the digital value of the conversion. The input voltage illustrates the voltage $V_{ref}$ at the center thereof, the voltage to $2V_{ref}$ and the voltage ½ $V_{ref}$. For unity gain, there is a line 802 representative thereof. Thus, when $V_{in}=V_{ref}$, the maximum digital output value will be present of all "1's." This is a situation wherein the amount of charge stored on the array is $Q=C_TV_{in}$, wherein the total capacitance in the array for the conversion cycle is $C_T$. Thus, no additional charge can be added to the array that will be redistributed during the conversion cycle. For the condition wherein certain capacitors that are used in the convergence cycle are not connected to $V_{in}$ during the sampling cycle, an attenuation will occur, one representative curve or plot being a line 804. This represents a situation wherein only one-half of the total SAR capacitance is connected to $V_{in}$ during the sample cycle. During conversion, all of the SAR capacitors are utilized for the distribution phase. This results in a gain of one-half and the maximum digital output being provided when $V_{in}=2V_{ref}$. For a gain operation wherein the maximum voltage on the input $V_{in}$ will be only one-half of the reference voltage, a line 806 is provided which provides maximum digital output value at a voltage of one-half $V_{ref}$. This is facilitated by doubling the amount of the capacitance in the SAR array during the sampling cycle such that the amount of charge introduced thereto is raised.

Figure 9:
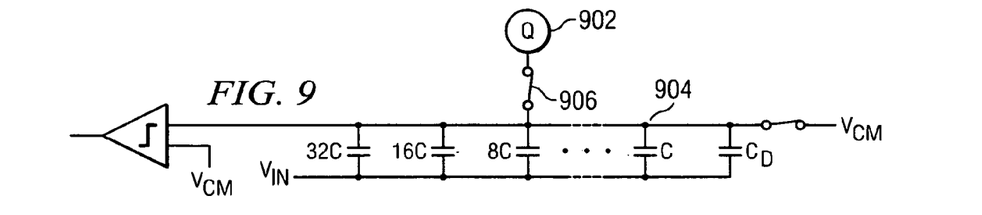
FIG. 9 illustrates a diagrammatic view of the method for introducing charge to increase the gain.

Referring now to FIG. 9, there is illustrated a diagrammatic view of the method for introducing charge to increase the gain. As noted hereinabove, the way to introduce charge was to add additional capacitance during the sampling cycle that was not utilized during the conversion cycle. However, the disadvantage to this is that, during the conversion cycle, the total capacitance has increased. When a single capacitor is raised to $V_{ref}$ during one step in the SAR conversion cycle, the delta V that occurs on the input to the comparator is a factor of the size of the capacitance that is raised to $V_{ref}$ and total capacitance. Therefore, it will be the ratio of $C_{Toggle}/C_{Total}$. As the total capacitance increases, the size of the delta V decreases and it is possible that the value can fall significantly such that the noise on the input to the comparator does not allow resolving thereof. Therefore, what is necessary is to provide a charge source 902 that can be switched onto a common node 904 with a switch 906 during sampling, at which time the common node 904 is connected to $V_{CM}$. The capacitors in the array, there being illustrated an 8-bit array of these capacitors, the SAR capacitors, will be connected on the switched plates thereof to $V_{in}$. Thus, these capacitors will contribute the normal amount of charge to the array and the additional amount of charge that was provided by the parasitic capacitor 714 of FIG. 7, will be provided by the charge source 902. At the conversion cycle, the switch 906 is opened. Thus, the total capacitance during conversion will be no different than the normal operation.

Figure 10:
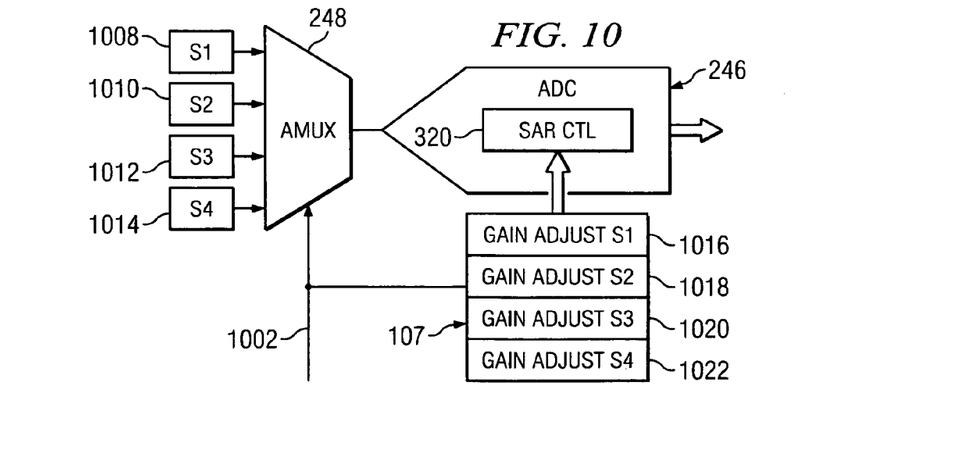
FIG. 10 illustrates a block diagram of an embodiment illustrating multiple gain adjusts for multiple sensors.

Referring now to FIG. 10, there is illustrated a block diagram of an application of a gain adjusted ADC as described hereinabove. The ADC 246, as described hereinabove, interfaces with the analog multiplexer 248. The analog multiplexer 248 is operable to receive control signals which are operable to select one of sensor multiple ports. This control signal is received on a control signal input 1002. This also provides control signals to the gain adjust register 107. As noted hereinabove, the gain adjust register 107 is accessible by the microcontroller 202 in the operation thereof. Therefore, each input to the analog multiplexer 248 can have a separate gain adjust associated therewith. For example, in the example illustrated in FIG. 10, there are provided four sensors, S1, S2, S3 and S4 associated with blocks 1008, 1010, 1012 and 1014. Each of the sensors has associated therewith in the gain adjust register 107 a separate register location, locations 1016,1018, 1020 and 1022, respectively. Therefore, whenever sensor S1 is selected, gain adjust register location 1016 in gain adjust register 107 will be accessed. These are basically addressable locations within the flash memory, or they could be special function registers or they could be hard wired registers that are mask programmable. What is important is that they define for the SAR controller 320 the ones of the capacitors in the SAR array that are to be connected on the switched plate thereof to ground, as compared to $V_{in}$ during the sampling phase. By so defining, as described hereinabove, the gain thereof will be adjusted.

The reason to provide separate gain adjust values for each of the sensors is that each sensor may have different parameters and may have different full scale values. For example, one sensor may have an input value to the analog input of the multiplexer 248 and to the ADC 246 that is twice the value of $V_{ref}$. In that situation, one would want to have a gain of one-half. If the full scale range were one-half the value of $V_{ref}$, then one would want to add gain and have a gain of 2.0. By matching the particular gain adjust value in the gain adjust register 107 with the particular input, an additional level of versatility can be provided to the user to ensure that they utilize the full capabilities provided by the ADC 246 incorporated in the microcontroller architecture on the integrated circuit. For situations where the full scale is less than $V_{ref}$, this will merely result in a lower resolution at the LSB. However, for situations where the full scale value is greater than $V_{ref}$, this can be significant. The reason is that, When the input voltage exceeds $V_{ref}$, the ADC 246 will basically go "flat" and output the same full scale digital value. Thus, by providing independent adjustment of the gain of the ADC 246 at the SAR capacitor array, one can provide attenuation and/or gain thereto. This can be a manufactured access only mode used during calibration or, alternatively, it can be provided to the user as an accessible register to program.

What is claimed is:

1. A successive approximation register (SAR) analog-to-digital Converter (ADC) with variable gain having a SAR capacitor array with a plurality of switched capacitors therein with varying weights and a SAR controller for sampling an input voltage thereon in a sampling phase, and redistributing the charge stored thereon in a conversion phase in accordance with a SAR conversion algorithm, comprising:

a gain adjust register for defining an amount of charge that, in a first gain change mode, is to be added to the capacitor array prior to the conversion phase relative to a predetermined amount of charge representing substantially unity gain and, in a second gain change mode, is to be subtracted from the capacitor array prior to the conversion phase relative to the predetermined amount of charge representing substantially unit gain; and a charge control device for varying the amount of charge stored in the array prior to the conversion phase in accordance with the contents of said gain adjust register such that the amount of charge redistributed during the conversion phase is adjusted.

2. The ADC of claim 1, wherein:

said charge control device is operable to inhibit sampling of the input voltage on at least one of the array capacitors in the SAR capacitor array to remove charge from the SAR capacitor array wherein, when inhibited from sampling, gain is decreased;

wherein said gain adjust register defines whether sampling of the input voltage is inhibited by said charge control device;

which said at least one capacitor is utilized for the charge redistribution operation associated with the conversion phase.

3. The ADC of claim 1, wherein:

said charge control device is operable to inhibit sampling of the input voltage on select ones of the array capacitors in the SAR capacitor array to remove charge from the SAR capacitor array wherein, when inhibited from sampling, gain is decreased by an amount proportional to the number and weight of the capacitors inhibited;

wherein said gain adjust register defines the ones of the SAR array capacitors on which sampling of the input voltage is inhibited by said charge control device;

which said select ones of the SAR array capacitors are utilized for the charge redistribution operation associated with the conversion phase.

4. The ADC of claim 1, wherein:

an additional capacitor is added to the SAR capacitor array during sampling to increase the amount of charge added to the SAR capacitor array;

said charge control device is operable to inhibit sampling of the input voltage on at least one of the array capacitors in the SAR capacitor array to remove charge from the SAR capacitor array wherein, when inhibited from sampling, gain is unity and when not inhibited, gain is increased, said at least one capacitor substantially equal to said additional capacitor;

wherein said gain adjust register defines whether sampling of the input voltage is inhibited by said charge control device;

and which at least one of the array capacitors is utilized in the conversion phase.

5. The ADC of claim 1, wherein:

an additional capacitor is added to the SAR capacitor array during sampling to increase the amount of charge added to the SAR capacitor array;

said charge control device is operable to inhibit sampling of the input voltage on select ones of the array capacitors in the SAR capacitor array to remove charge from the SAR capacitor array wherein, when inhibited from sampling, gain is unity and when not inhibited, gain is increased by an amount proportional to the number and weight of the capacitors not inhibited, said select ones of the array capacitors in the SAR capacitor array substantially equal to said additional capacitor;

wherein said gain adjust register defines whether sampling of the input voltage is inhibited by said charge control device;
and which select ones of the array capacitors in the SAR capacitor array are utilized in the conversion phase.

6. A successive approximation register (SAR) analog-to-digital Converter (ADC) with variable gain comprising:
   a SAR capacitor array with a plurality of switched capacitors therein with varying weights each having a common plate connected to a common node and a switched plate;
   a comparator for comparing the voltage on the common node of the capacitor array with a common reference voltage;
   a SAR controller for sampling an input voltage on said capacitor array in a sampling phase, and redistributing the charge stored thereon in a conversion phase by selectively increasing the voltage on select ones of said capacitor array in accordance with a SAR conversion algorithm;
   a gain adjust register for defining an amount of charge that, in a first gain change mode, is to be added to the capacitor array prior to the conversion phase relative to a predetermined amount of charge and, in a second gain change mode, is to be subtracted from the capacitor array prior to the conversion phase relative to the predetermined amount of charge
   a charge control device for varying the amount of charge stored in the array prior to the conversion phase in accordance with the contents of said gain adjust register such that the amount of charge redistributed during the conversion phase is adjusted; and
   wherein said common reference voltage comprises a common mode voltage and wherein said common node is connected to said common node voltage, and the switched plate is connectable to the input voltage during the sampling phase and, during the conversion phase, the switched plate of each of said array capacitors are connectable to conversion reference voltage to redistribute the charge thereon to the array and change the voltage on the common node.

7. The ADC of claim 6, wherein said charge control device selectively controls the connection of said switched plate of at least one of said array capacitors to force connection thereof to the common reference voltage during the sampling phase, the gain adjust register defining whether said at least one of said array capacitors is connected to the input voltage or the common reference voltage during the sampling phase, wherein gain is decreased when connected to the common reference voltage.

8. The ADC of claim 6, wherein said charge control device controls the connection of said switched plate of select ones of said array capacitors to force connection thereof to the common reference voltage during the sampling phase, the gain adjust register defining whether said select ones of said array capacitors are connected to the input voltage or the common reference voltage during the sampling phase, wherein gain is decreased when connected to the common reference voltage.

9. The ADC of claim 6, wherein said charge control device controls the connection of said switched plate of at least one of said array capacitors to force connection thereof to the common reference voltage during the sampling phase, the gain adjust register defining whether said at least one of said array capacitors is connected to the input voltage or the common reference voltage during the sampling phase, wherein gain is decreased when connected to the common reference voltage and, wherein an additional capacitor equal in value to said at least one of said array capacitors is connected with one plate thereof connected to said common node and a switched plate controlled by said charge control device so as to sample the input voltage thereon during the sampling phase and connected to the common mode voltage during the conversion phase.

10. A method for varying the gain of a successive approximation register (SAR) analog-to-digital Converter (ADC) having a SAR capacitor array with a plurality of switched capacitors therein with varying weights and a SAR controller for sampling an input voltage thereon in a sampling phase, and redistributing the charge stored thereon in a conversion phase in accordance with a SAR conversion algorithm, comprising the steps of:
    defining in a gain register an amount of charge that, in a first gain change mode, is to be added to the capacitor array prior to the conversion phase relative to a predetermined amount of charge representing substantially unity gain and, in a second gain change mode, is to be subtracted from the capacitor array prior to the conversion phase relative to the predetermined amount of charge representing substantially unit gain; and
    varying with a charge control device the amount of charge stored in the array prior to the conversion phase in accordance with the contents of the gain adjust register such that the amount of charge redistributed during the conversion phase is adjusted.

11. The method of claim 10, wherein:
    the step of varying with the charge control device is operable to inhibit sampling of the input voltage on at least one of the array capacitors in the SAR capacitor array to remove charge from the SAR capacitor array wherein, when inhibited from sampling, gain is decreased;
    wherein the gain adjust register defines whether sampling of the input voltage is inhibited by the step of varying;
    which the at least one capacitor is utilized for the charge redistribution operation associated with the conversion phase.

12. The method of claim 10, wherein:
    the step of varying with the charge control device is operable to inhibit sampling of the input voltage on select ones of the array capacitors in the SAR capacitor array to remove charge from the SAR capacitor array wherein, when inhibited from sampling, gain is decreased by an amount proportional to the number and weight of the capacitors inhibited;
    wherein said gain adjust register defines the ones of the SAR array capacitors on which sampling of the input voltage is inhibited by the step of varying;
    which select ones of the SAR array capacitors are utilized for the charge redistribution operation associated with the conversion phase.

13. The method of claim 10, wherein:
    an additional capacitor is added to the SAR capacitor array during sampling to increase the amount of charge added to the SAR capacitor array;
    the step of varying with the charge control device is operable to inhibit sampling of the input voltage on at least one of the array capacitors in the SAR capacitor array to remove charge from the SAR capacitor array wherein, when inhibited from sampling, gain is unity and when not inhibited, gain is increased, the at least one capacitor substantially equal to the additional capacitor;

wherein the gain adjust register defines whether sampling of the input voltage is inhibited by the step of varying;

and which at least one of the array capacitors is utilized in the conversion phase.

14. The method of claim 10, wherein:

an additional capacitor is added to the SAR capacitor array during sampling to increase the amount of charge added to the SAR capacitor array;

the step of varying with the charge control device is operable to inhibit sampling of the input voltage on select ones of the array capacitors in the SAR capacitor array to remove charge from the SAR capacitor array wherein, when inhibited from sampling, gain is unity and when not inhibited, gain is increased by an amount proportional to the number and weight of the capacitors not inhibited, the select ones of the array capacitors in the SAR capacitor array substantially equal to the additional capacitor;

wherein the gain adjust register defines whether sampling of the input voltage is inhibited by the step of varying;

and which select ones of the array capacitors in the SAR capacitor array are utilized in the conversion phase.

* * * * *